(12) United States Patent
Hanson et al.

(10) Patent No.: US 6,292,402 B1
(45) Date of Patent: Sep. 18, 2001

(54) PREFETCH WRITE DRIVER FOR A RANDOM ACCESS MEMORY

(75) Inventors: David R. Hanson, Brewster; Toshiaki Kirihata, Poughkeepsie; Gerhard Mueller, Wappinger Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/456,589

(22) Filed: Dec. 8, 1999

(51) Int. Cl.[7] .................................................. G11C 16/04
(52) U.S. Cl. .............................. 365/189.05; 365/230.08; 365/233
(58) Field of Search ............................ 365/189.05, 233, 365/189.08, 230.06, 230.08

(56) References Cited

U.S. PATENT DOCUMENTS 5,813,023 * 9/1998 McLaury ............................ 711/105
6,134,180 * 10/2000 Kim et al. ........................... 365/233
6,163,491 * 12/2000 Iwamoto et al. ..................... 365/201

* cited by examiner

*Primary Examiner*—Vu A. Le
*Assistant Examiner*—Hien Nguyen
(74) *Attorney, Agent, or Firm*—Eric W. Petraske

(57) ABSTRACT

A prefetch input write driver for a random access memory (RAM) and a RAM including the prefetch input write driver. The prefetch input write driver is especially for a synchronous dynamic RAM (SDRAM). The prefetch input write driver includes a data input stage receiving data, an enable stage receiving a corresponding data enable, and a write driver providing received data to a memory array in response to a write signal and the corresponding enable stage state. The data stage and the enable stage may each include two or more series connected three state drivers and a latch at the output of each three state driver. As data passes through the data stage a corresponding enable state is passed through the enable stage. Data is passed to the RAM array if the enable state indicates that data in the data stage is to be written into the array.

29 Claims, 6 Drawing Sheets

PREFETCH WRITE DRIVER FOR A RANDOM ACCESS MEMORY

RELATED APPLICATION

The present invention is related to U.S. patent application Ser. No. 09/456,588 entitled "A SDRAM With A Maskable Input" to Hanson et al., assigned to the assignee of the present application, filed coincident herewith and incorporated herein by reference.

BACKGROUND OF THE INVENTION

1. Field of the Invention

The present invention generally relates to semiconductor memories and, more particularly, to data input circuits for random access memories and especially for synchronous dynamic random access memory write timing.

2. Background Description

Synchronous Dynamic Random Access Memory (SDRAM) chips are well known. Essentially, a state of the art SDRAM, is accessed by providing an initial memory location or address that identifies a first data access location in a string of serially accessed contiguous locations. The first address is known as the burst starting address and the data string is known as the burst or data burst. The burst may have a width, which may be 1 bit, 4 bits or 8 or more bits, and a length that may be 2, 4, 8 or more locations. Burst width and length are set at the SDRAM architecture designer's discretion and the result of numerous design trade offs. Internally to the SDRAM, during any particular access, all of the cells in the burst are accessed simultaneously in parallel and serialized for external burst transfers.

This serial external data transfer and parallel internal data transfer is also typically referred to as "data prefetch." Thus, data is passed to or retrieved from the chip serially, i.e., externally, and data passed to the chip may then be written to the array in parallel or read from the array in parallel to be passed off chip serially. Using data prefetch reduces the number of external data lines, which decreases chip area. Also, prefetch allows accessing the array at a significantly lower frequency than the external data rate.

FIG. 1 shows a write driver circuit 100 for a prior art SDRAM. The write driver 100 is typically included in a sense amplifier for writing input data 102 to a memory array 103. A receiver 104 passes the input data when the receiver enable 106 is asserted. A latch 108 temporarily stores the data from the receiver 104. The latched data is passed to the input of write driver 110. When write enable 112 is asserted, write driver 110 passes the latched data to the memory array 103 for storage at a selected memory location. This approach is adequate when every data bit presented to the input is to be stored in the memory array 103.

As SDRAM performance objectives and operating frequency are pushed, increasingly, there is a need to prefetch 2 or more data bits. Increasing the number of prefetch bits produces an effective external operating frequency that is independent of the array operating frequency. However, existing prefetch architectures merely replicate both the inputs and the write drivers for the number of pre-fetched bits. This approach increases the number of data busses and its associated bus area, which in turn results in a larger SDRAM chip.

Thus, there is a need for a improving SDRAM write performance without increasing SDRAM chip size.

SUMMARY OF THE INVENTION

It is therefore a purpose of the present invention to improve Dynamic Random Access Memory (DRAM) write performance;

It is another purpose of the present invention to decrease Synchronous DRAM (SDRAM) area;

It is yet another purpose of the present invention to improve SDRAM write performance without increasing SDRAM area.

The present invention is a prefetch input write driver for a random access memory (RAM) and, especially a synchronous dynamic RAM (SDRAM) with a multi-bit prefetch. The prefetch input write driver includes a data input stage receiving a time multiplexed data input. The time multiplexed data input is provided to at least 2 write drivers that demultiplex the input data and pass received individual data bits to a memory array responsive to a write signal and a corresponding enable state of an enable stage. The data input stage and the enable stage may each include two or more series connected three state drivers and a latch at the output of each three state driver. As each data bit passes through a data input stage, a corresponding enable state is passed through the enable stage. Each data bit is passed to the RAM array if the enable state indicates that data in the data stage is to be written into the array.

BRIEF DESCRIPTION OF THE DRAWINGS

The foregoing and other objects, aspects and advantages will be better understood from the following detailed preferred embodiment description with reference to the drawings in which.

DETAILED DESCRIPTION OF A PREFERRED EMBODIMENT OF THE INVENTION

Figure 1:
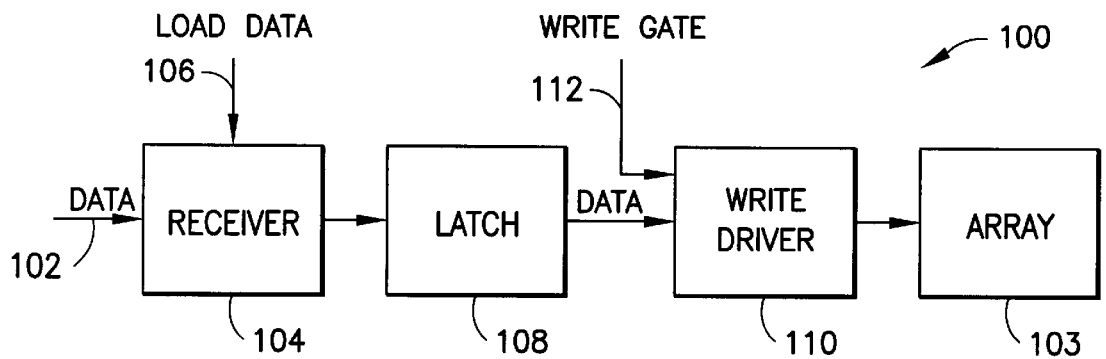
FIG. 1 is a typical prior art SDRAM input path.
Figure 2:
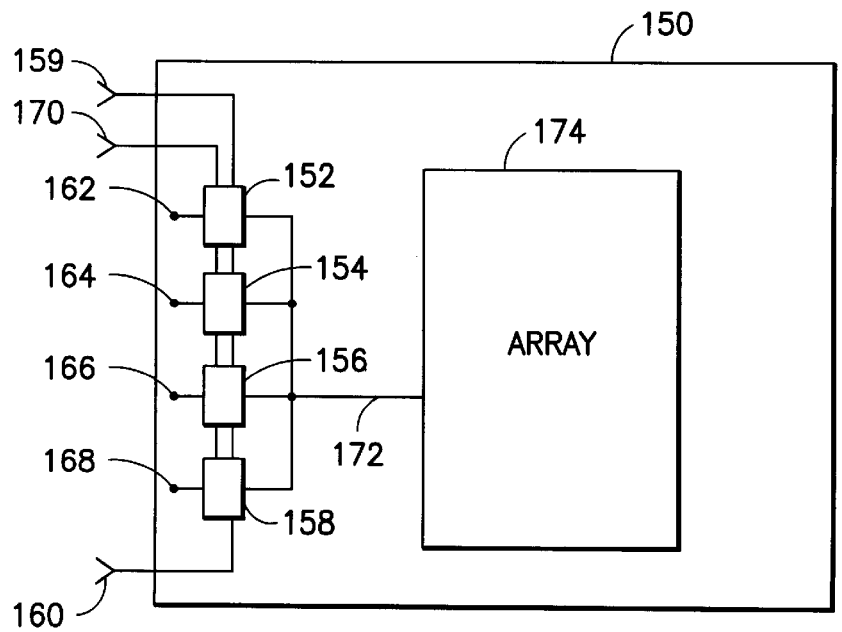
FIG. 2 is a block diagram of a preferred embodiment SDRAM chip including four (4) data load and write driver circuits.

Referring now to the drawings, and more particularly, FIG. 2 is a block diagram of a preferred embodiment SDRAM chip 150 including four (4) Prefetch Input Write driver circuits 152, 154, 156 and 158 each being a preferred data load and write driver circuit. A common Data line 159 and Write Data line 160 is provided to all 4 of the preferred write driver circuits 152, 154, 156 and 158. Four individual Load Data lines 162, 164, 166 and 168 are provided to each corresponding Write Driver circuits 152, 154, 156 and 158. All four Write Driver circuit 152, 154, 156 and 158 share a common enable line 170 with outputs, labeled collectively 172, that are provided to a memory array 174 in parallel. Enable information corresponding is presented serially on enable line 170 simultaneously with and corresponding to data input information provided on Data Line 159. For each data bit provided on Data Line 159, the corresponding state on enable line 170 determines whether the data bit is written into the array. Data is loaded serially into the write driver and then, written in parallel into the array. This serial to parallel conversion is referred to herein as a data prefetch.

Figure 3:
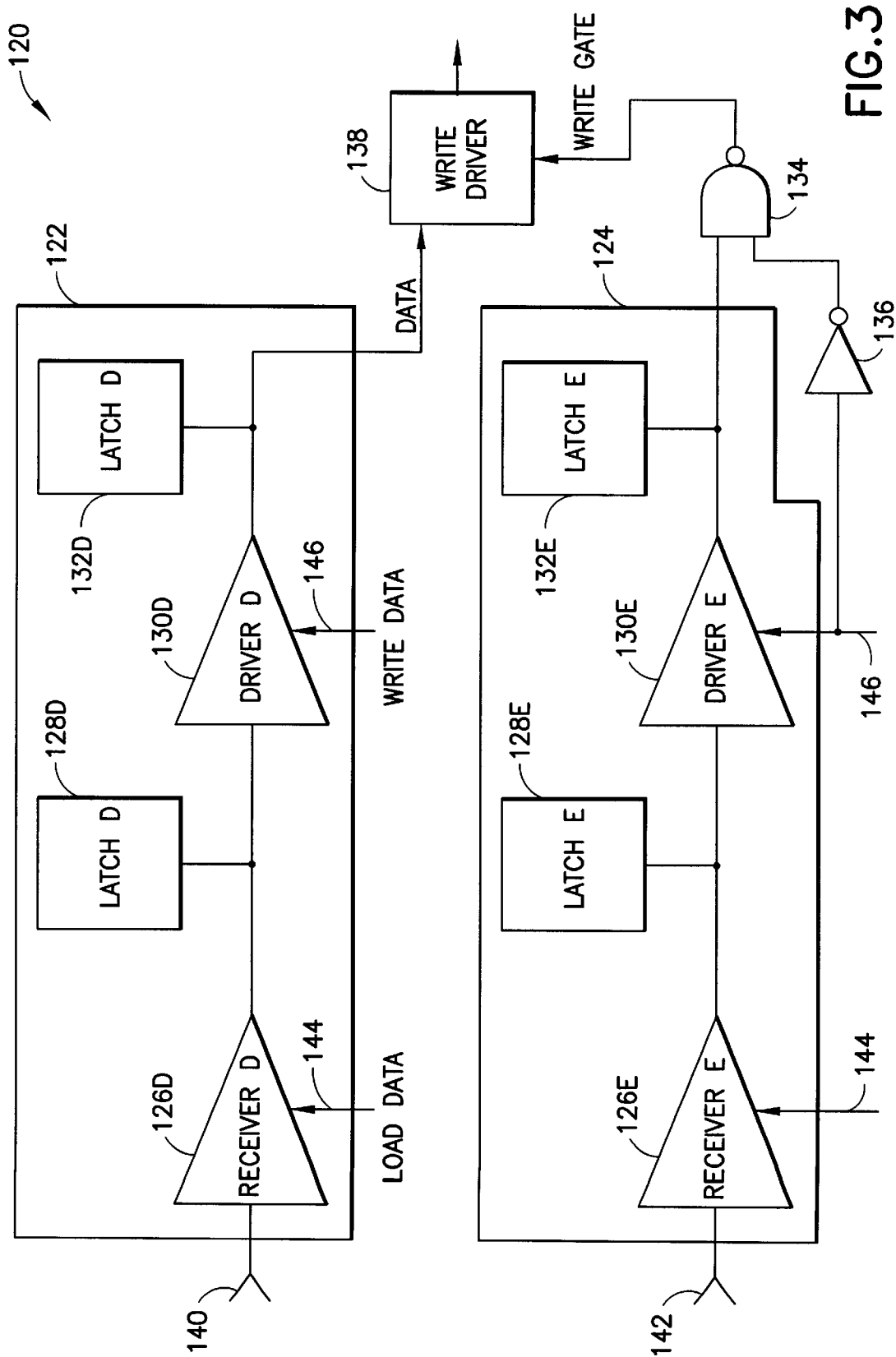
FIG. 3 shows the preferred embodiment pipelined input data path and write driver circuit corresponding to the 4 data load and write driver circuits of FIG. 2.

FIG. 3 schematically shows the preferred embodiment Prefetch Input Write driver circuit 120 corresponding to Prefetch Input Write driver circuits 152, 154, 156 and 158 of FIG. 2. The preferred embodiment pipelined input data path and write driver circuit 120 includes two parallel pipelined paths, a data path 122 and a write enable path 124. Each path 122, 124 includes an input buffer or receiver 126D,E receiving an input and selectively passing the input to a first latch 128D,E. A driver 130D,E selectively passes data latched in first latch 128D,E to a second latch 132D,E. Data latched in the second latch 132D,E is the path 122, 124 output. The output of write enable path 124 is an input to NAND gate 134. Inverter 136 inverts the Write Enable to driver 130E of write enable path 124. The output of Write Enable inverter 136 is the second input to NAND gate 134. The output of NAND gate 134 is the enable input to Write driver 138 and the data output of data path 122 is the data input to Write Driver 138.

Data and a corresponding write enable bit are presented to the inputs 140, 142 of receivers 126D,E. Corresponding receivers 126D,E of both paths 122, 124 are, preferably, driven by the same Load Data signal 144. Also, corresponding drivers 130D,E of both paths 122, 124 are, preferably, driven by the same Write Data signal 146. For the preferred embodiment, receivers 126D,E are enabled by a low on the Load Data signal 144 and drivers 130D,E are enabled by a high on Write Data signal 146. When the Load Data signal 144 is asserted, receivers 126D,E pass the data and enable state to latches 128D,E. Latches 128D,E hold their respective states at the input to drivers 130D,E even after the receivers 126D,E are disabled by the Load Data signal 144 switching states. Between write accesses to the array, Write Data signal 146 is high enabling drivers 130D,E, which pass the data and enable state to latches 132D,E. Data in latch 132D is also provided to the input of Write Driver 138 and the enable state is passed to NAND gate 134. Inverter 136, inverting the Write Data signal 146, drives low the other input of NAND gate 134 to hold the Write Driver 138 disabled.

When the Write Data signal 146 is driven low, drivers 130D,E are disabled, placing them in a high impedance state and latches 132D,E continue to hold the state of the data and enable bit. With the Write Data signal 146 low the Load data signal 144 is asserted without disturbing the contents of latches 130D,E. Further, inverter 136, inverting Write Data signal 146 provides a "1" to the input of NAND gate 134. If the enable bit is set, i.e., the output of driver 130E is a "1" then, NAND gate 134 drives the enable input of Write Driver 138 low, enabling the Write Driver 138, which passes data to the array where that data bit is stored. If, however, the enable bit is not set, i.e., the output of driver 130E is a "0", the output of NAND gate 134 remains high disabling the WRITE driver 138, which ignores data held in latch 132D and the corresponding array data remains unchanged. Regardless of the state of the particular enable bit, during the assertion of the Write Data signal 146 data and a corresponding enable may be loaded into the first latches 128D,E because drivers 130D,E are disabled by the Write Data signal 146 being low.

Figure 4:
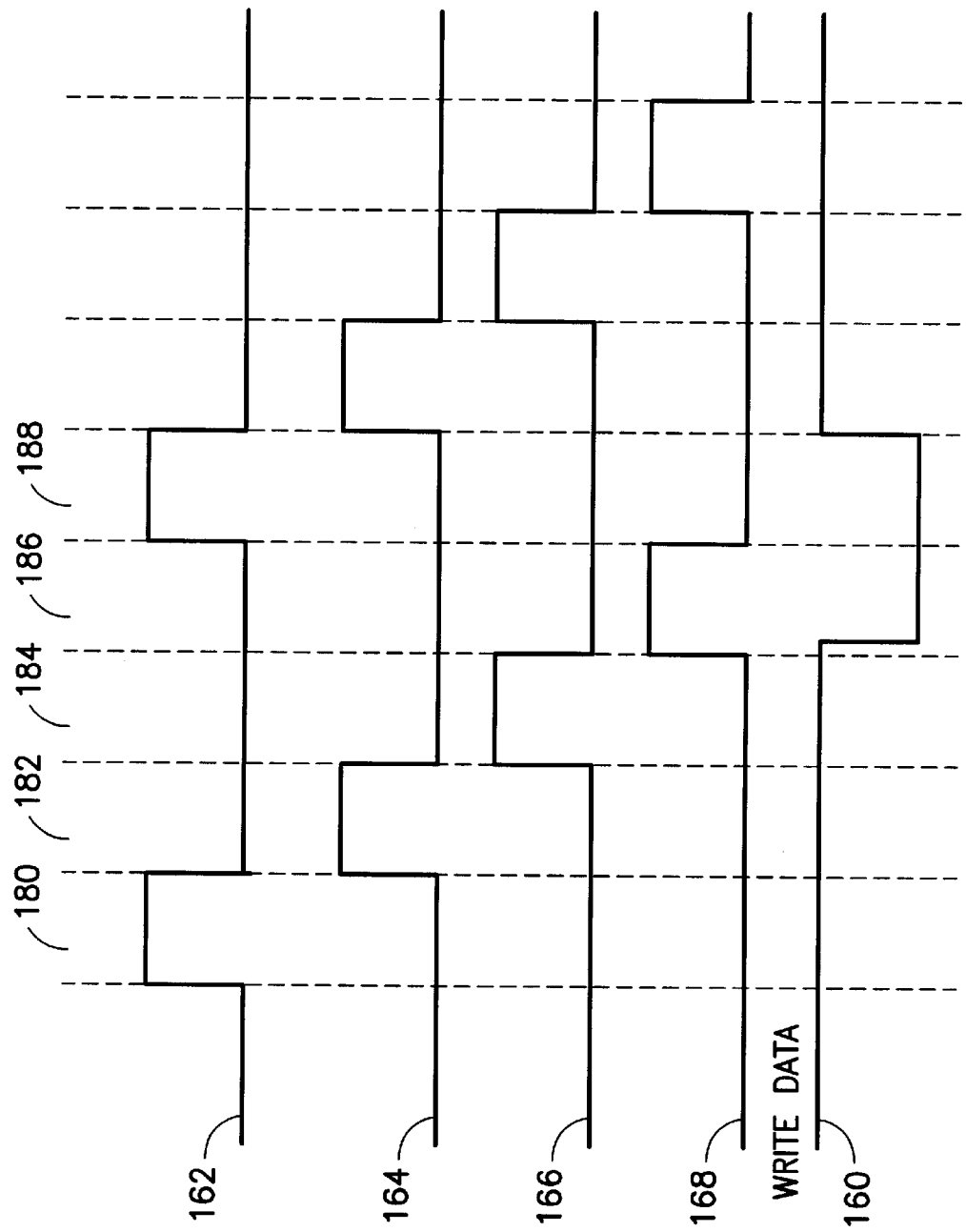
FIG. 4 is a timing diagram for loading data into the SDRAM of FIG. 2.

FIG. 4 is a timing diagram for loading data into the SDRAM 150 of FIG. 2 showing a Write Data signal 160 and four Load data signals 162, 164, 166 and 168. First, in period 180, data and enable information are loaded into the first write driver circuit 152. Since the Write Data signal 160 is high, nothing is passed to the array 174. In the three subsequent periods 182, 184, 186, data is loaded into the other three write driver circuits 154, 156 and 158, respectively. Again during periods 182 and 184, the Write Data signal 160 remains high and nothing is passed to the array 174. However, during the fourth period 186, immediately after sufficient time has passed that the data and enable information have been passed to the second latches 132D,E, the Write Data signal 160 is driven low, which causes each enabled Write driver 138 to pass the data in the second latches 132D to the array 174. Also, the Write Data signal 160 may remain low, during subsequent load periods as in load period 188. Thus, writing an array with a write time substantially longer than the bit burst period would not require pausing the data transfer or any special timing.

Figures 5, 5A, 5B:
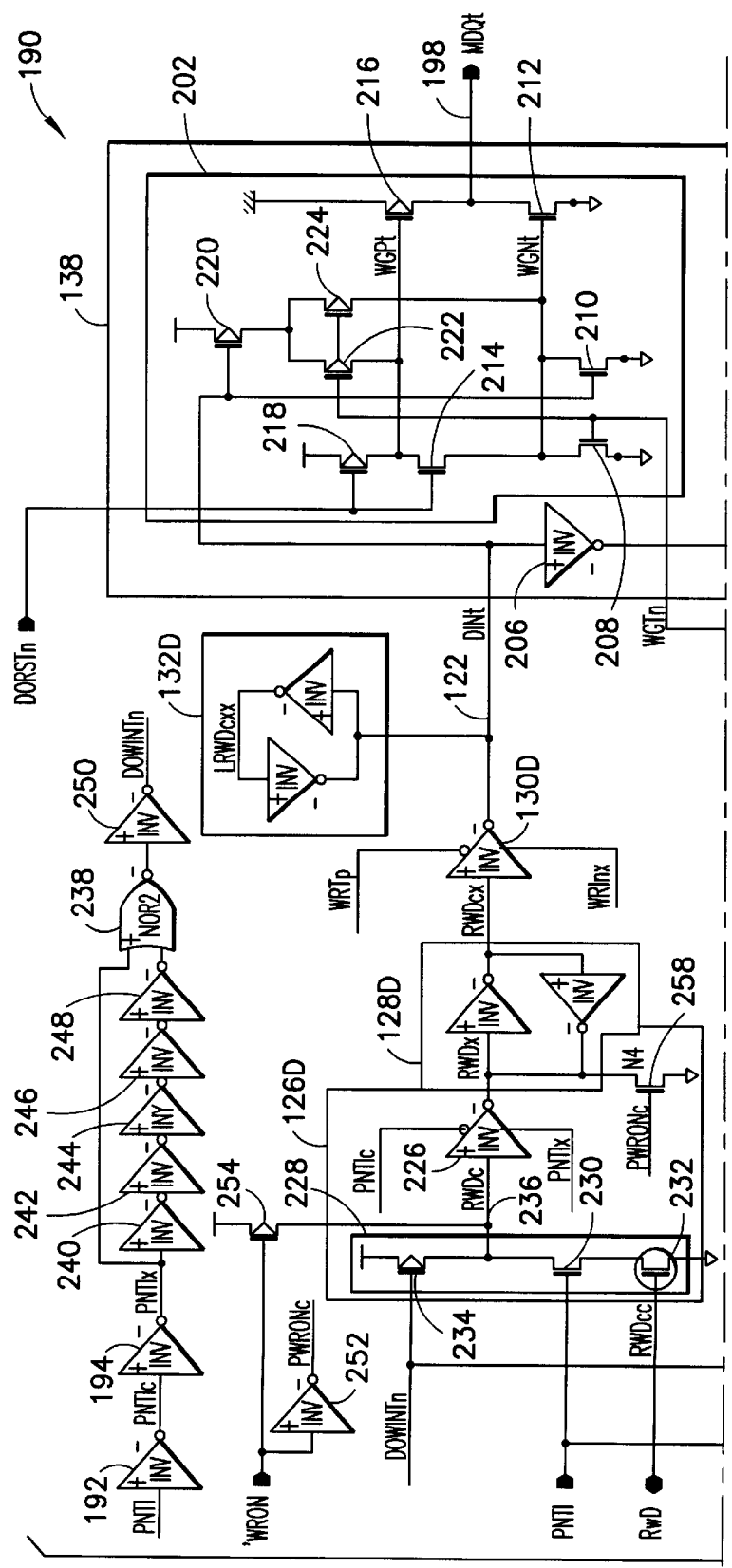
FIG. 5 is a second preferred embodiment data load and write driver circuit.
Figure 5B:
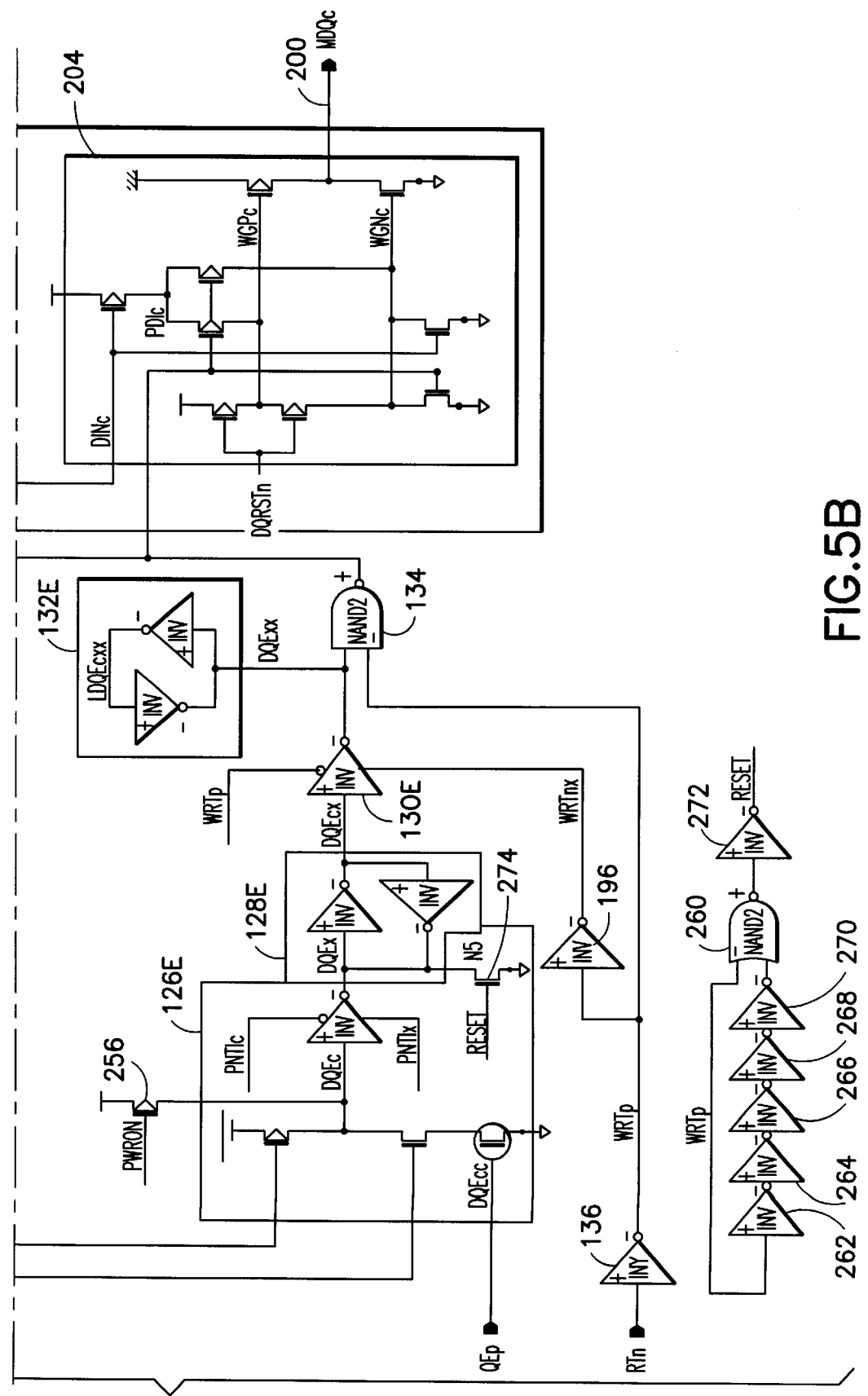

FIG. 5 is a second preferred embodiment data load and write driver circuit 190 similar to the first preferred embodiment data load and write driver circuit 120 with elements providing like functions being labeled identically. Latches 128D,E and 132D,E are each a pair of cross coupled inverters. In this embodiment, receivers 126D,E and drivers 130D,E each are enabled/disabled by complementary pairs of signals. These complementary pairs of signals are provided from the Load Data signal by inverters 192, 194 and from the Write Data signal by inverter 136 and inverter 196 which inverts the output of inverter 136. Write driver 138 provides a pair of complementary data outputs 198, 200. Each output phase 198, 200 is driven by a three state output driver 202, 204, respectively. Latched data from data latch 132D is inverted by inverter 206 to provide a complementary pair, each being an input to a three state output driver 202, 204, respectively.

Each three state output driver 202, 204 includes a pair of parallel NFETs 208, 210 connected between ground and the gate of a driver NFET 212. The output of NAND gate 134 is connected to the gate of parallel NFET 208. The gate of the other parallel NFET 210 is driven by the data path 122 output or, the output of inverter 206. A fourth NFET 214 is connected between the gate of a driver PFET 216 and the common connection of NFETs 208, 210 with the gate of driver NFET 212. A reset line DQRST is connected to the gate of NFET 214 and to the gate of PFET 218. PFET 128 is connected between a supply voltage source and the drain of NFET 214. The gate of a PFET 220 is driven by either the data path 122 output or the output of inverter 206. PFET 220 is connected between the supply voltage source and the common source connection of a pair of PFETS 222, 224. The gates of PFETs 222, 224 are both driven by the enable output of NAND 134. The drain of PFET 222 is connected to the common drain connection of NFET 214 and PFET 218 with gate of a driver PFET 216. The drain of the PFET 224 is connected to the common connection of the drains of NFETs 208, 210 with the source of NFET 214 and the gate of a driver NFET 212.

In this embodiment, the input receivers 126D,E each include a three state driver 226 driven by a two input dynamic receiver 228. The two input dynamic receiver 228 includes two series connected NFETs 230, 232 and a clocked PFET 234 load. The series connected NFETs 230, 232 are connected between ground and output 236 and clocked PFET 234 load is connected between the supply voltage and the output 236. The gate of one NFET 230 is driven by the Load Data signal (PNTI) 144 and the gate of the other NFET 232 is driven by a respective data input RWD or an enable input. The output 236 of Dynamic receiver 228 is the input to the three state inverters 226.

The output of inverter 194 is also an input to a pulse generator that includes NOR gate 238 and 5 series connected inverters 240, 242, 244, 246 and 248. The pulse generator output is inverted by inverter 250 to provide the clock (DQWINT$_n$) gating load PFET 234 in two input dynamic receiver 228. A power on signal (PWRON) is connected to the input to inverter 252 and is connected to the gate of PFETs 254, 256, which are each connected between the supply voltage and the output 236 of a respective Dynamic receiver 228. The output of inverter 252 drives the gate of NFET 258 in receiver 126D, which is connected between ground and the input to latch 128D.

The output of inverter 136 is also the input to a second pulse generator that includes NAND gate 260 and the input to 5 series connected inverters 262, 264, 266, 268 and 270. The pulse generator output is inverted by inverter 272. The output of inverter 272 drives the gate of NFET 274 is connected between ground and the input to latch 128E.

Initially, at power on, PWRON is low turning on PFETS 254 and 256 to force high the respective input (RWD$_c$ and DQE$_c$) to three state inverter 226. In both paths 122, 124 the three state inverter 226 is in a high impedance state because the PNTI signal, which corresponds to Load Data signal 144, is low. Inverter 252, inverting PWRON, places a high on the gate of transistor 258, which forces RWD$_x$ low on the side of latch 128D at the output of receiver 126D. The low on RWD$_x$ sets the latch and RWD$_{cx}$ is high. WRT$_n$(which corresponds to Write Data signal 146 in FIG. 3) is high. PNTI low also places both three state inverters 226, 228 in their high impedance state. The high on WRT$_n$ enables both three state drivers 130D, E, which pass the high on RWD$_{cx}$ and DQE$_{cx}$ to latches 132D,E, respectively, and the data output of driver 132D is also passed to Write Driver 138.

However, the enable is blocked by NAND gate 134 because WRT$_n$ is inverted by inverter 136 and so, provides a low input to NAND gate 134, preventing NAND gate 134 from passing the enable. The low input to NAND gate 134 from inverter 136 holds the output of the NAND gate 134 high, disabling three state output drivers 202, 204. The high from NAND gate 134, turns off both PFETs 222, 224 and turns on NFET 208. The driver 138 is initialized by driving DQRST$_n$ high which turns on NFET 214 and PFET 218 off. NFET 218 drives the gate of PFET 216 low to turn it on. NFET 208 holds the gate of driver NFET 212 low and, therefore, off. PFETs 222, 224 being off isolate the respective driver FET 216, 212 gates from PFET 220, which is driven by the output of the data path 122 or inverter 206. Thus, with driver NFET 212 off and driver PFET 216 on, the driver 138 is in its precharge state.

After an initial power up period, PWRON rises turning off PFETS 254 and 256, the output of inverter 252 falls turning off NFET 258. As with the first preferred embodiment, during normal operation a data bit and a corresponding enable state bit are provided to inputs RWD and DQE$_p$, respectively. These inputs are NAND'ed in dynamic receiver 228 with the Load Data signal 144, i.e., PNTI. When PNTI is driven high, both three state drivers 226 are enabled and, the clock (DQWINT$_n$) gating clocked load PFETs 234 is remains high. The shared data input line is loaded and inverted by dynamic receiver 228 and passed to a respective three state drivers 226 which re-inverts and passes the data or enable bit to latch 128D,E. Since the Write Data signal 146 (WRT$_n$) is high, drivers 130D,E pass the contents of latches 128D,E to second latches 132D,E.

When PNTI is driven low, three state drivers 226 are forced into their high impedance state and the PNTI input to dynamic receiver 228 opens the path to ground at the output 236. Also, DQWINT$_n$ is driven low for a period equal to the propagation delay of five inverters 240, 242, 244, 246 and 248, to precharged the output 236 high.

When the Write Data (WRT$_n$) signal 146 is driven low, drivers 130D,E are disabled and RESET is driven high for a period equal to the propagation delay of five inverters 262, 264, 266, 268 and 270. RESET being driven high turns on NFET 274 to reset enable path latch 128E. If the enable bit stored in enable path latch 132E is high, both inputs to NAND gate 134 are high and its output is pulled low, enabling Write Driver 138. In both three state output drivers 202, 204 both PFETs 222, 224 are turned on and NFET 208 is turned off. Thus, with the output of NAND gate 134 low, the complementary outputs 198, 200 reflect the state of data path second latch 132D. When the Write Data signal 146 returns high, drivers 130D,E are enabled and the contents of first latches 128D,E are passed to second latches 132D,E including, for this embodiment, the low from reset latch 128E.

Figure 6:
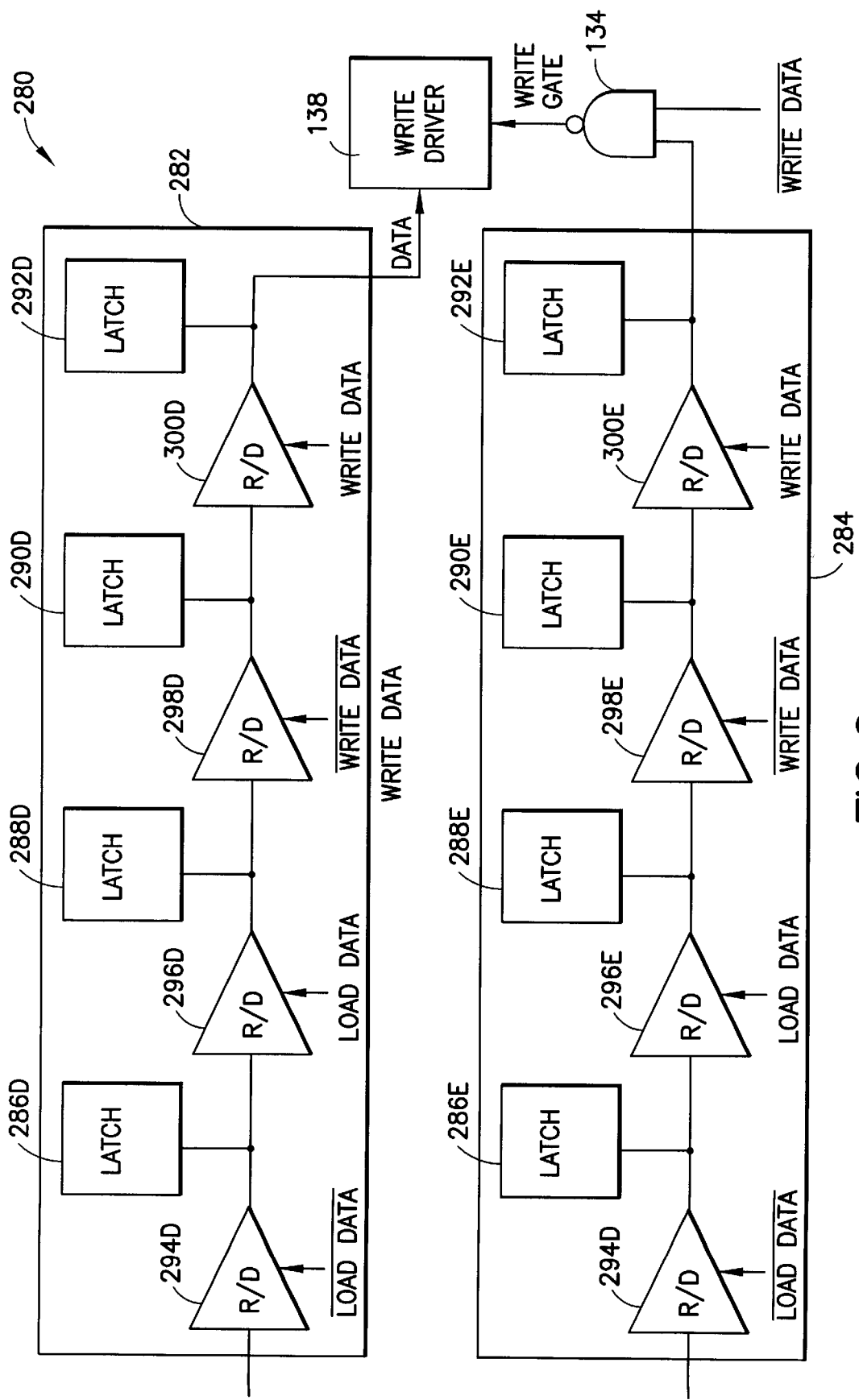
FIG. 6 shows a third embodiment pipelined input data path and write driver circuit.

FIG. 6 shows a third embodiment pipelined input data path and write driver circuit 280 of the invention, which also includes two parallel pipelined paths, a data path 282 providing a data input to a write driver 138 enabled by a write enable path 284. In this embodiment, both the Load Data signal and the Write Data signal are multi phase signal, with one phase ($\overline{\text{Write Data}}$) being combined with the enable output in NAND gate 134. Each path 282, 284 includes four latches 286D,E, 288D,E, 290D,E and 292D,E, each being driven by a corresponding three state driver 294D,E, 296D, E, 298D,E, and 300D,E, respectively. This embodiment is substantially the same as the first embodiment of FIG. 2 except that the input is pipelined, passed from stage to stage at the transition of each signal. Thus, with Load Data low the first driver 294D,E is enabled loading latch 286D,E and the second driver 296D,E is disabled. When Load Data rises, the first driver 294D,E is disabled; second driver 296D,E is enabled passing the contents of first latch 286D,E to second latch 288D,E. Until a write occurs, Write Data enables third driver 298D,E which passes the contents of second latch 288D,E to third latch 290D,E and Write Data is low disabling the fourth driver 300D,E. When a write occurs, Write Data is driven high disabling third driver 298D,E and Write Data which enables the fourth driver 300D,E, passing the contents of the third latch 290D,E to fourth latch 292D,E; and, passing the data path 282 output to the input of Write Driver 138 and the enable path 284 output to NAND gate 134.

Thus, a memory chip according to the present invention may include multiple write data circuits with the load data and write enable signals being asserted simultaneously. The write driver circuits may have a common data and write enable, and write data signals and with individual or grouped load data signals. The multiple load data signals for the multiple write data drivers allow data load operations to be executed serially externally, while the common write data signal causes the drivers to write to the array in a parallel.

Further, both a load data operation and a write data operation may be pipelined using preferred embodiment memory chips. This pipelined operation relaxes the timing budget for writing data into the array. The timing budget is relaxed because actually loading of data into the array is uncoupled from the write data operation because of the pipelined stages.

While the invention has been described in terms of preferred embodiments, those skilled in the art will recognize that the invention can be practiced with modification within the spirit and scope of the appended claims.

We claim:
1. A prefetch input driver for an integrated circuit, said prefetch input driver comprising:
   a data input stage receiving data;

an enable stage receiving a corresponding data enable; and a write driver providing said received data to an array responsive to a write signal and the state of said enable stage;

wherein said data stage and said enable stage each comprise:

an input buffer selectively receiving an input;

a first latch holding said received input;

a driver selectively passing the contents of said first latch; and a second latch maintaining a previous state of said driver when said driver is not passing the contents of said first latch.

2. A prefetch input driver as in claim 1, further comprising:

a write driver enable enabling said write driver responsive to a write signal and the state of said enable stage.

3. A prefetch input driver as in claim 2, wherein the means for enabling the write driver comprises a NAND gate, the NAND gate receiving the write signal and an output of the enable stage, an output of the NAND gate enabling the write driver.

4. A prefetch input driver as in claim 3, wherein the first latch and the second latch each comprise a pair of cross coupled inverters.

5. A prefetch input driver as in claim 4, wherein the input buffer and the driver each comprises a three state driver.

6. A prefetch input driver as in claim 5, wherein the write driver provides a pair of complementary outputs.

7. A prefetch input driver as in claim 6, wherein the write driver comprises a pair of three state output drivers.

8. A prefetch input driver as in claim 7, wherein each of the three state output drivers comprises:

a first driver device of a first conduction type;

a second driver device of a second conduction type connected to a conduction terminal of said first driver device;

a first pair of devices of said first conduction type each having a first conduction terminal connected in common, the output of said NAND gate being connected to the gates of said first pair, a second conduction terminal of a first of said first pair being connected to a control gate of the first driver device and a second conduction terminal of the second of said pair being connected to a control gate of the second driver device;

a second pair of devices, said second pair of devices being of said second conduction type and having a conduction terminal connected in common to a control gate of said second driver device, an output of said data stage coupled to a control gate of a first of said second pair and the output of said NAND gate being connected to the gate of the second of said second pair;

a third device of said first conduction type, the output of said data stage being coupled to a control gate of said third device, one conduction terminal of said third device being connected to the first terminal of the first pair of devices at the common connection; and a third device of said second conduction type connected between the control gates of the first driver device and the control gate of the second driver device.

9. A prefetch input driver as in claim 8, each of the three state output drivers further comprising:

a fourth device of said first conduction type connected to the control gate of the first driver device, the control gate of said fourth device of said first conduction type being connected to the control gate of the third device of the second conduction type.

10. A prefetch input driver as in claim 9, wherein the devices are field effect transistors, the first conduction type is p-type and the second conduction type is n-type.

11. A prefetch input driver as in claim 9, wherein the input buffer further comprises a dynamic receiver driving the three state driver.

12. A prefetch input driver as in claim 11, further comprising:

a reset pulse generator generating a reset pulse responsive to said write signal, said first latch in said enable stage being reset by said reset pulse.

13. A prefetch input driver as in claim 12, further comprising:

a clock pulse generator generating a clock clocking said dynamic receiver, said clock being generated responsive to said input buffer being disabled.

14. A prefetch input driver as in claim 13, wherein said integrated circuit is a random access memory and said array is a memory array.

15. A prefetch input driver for an integrated circuit, said prefetch input driver comprising:

a data input stage receiving data;

an enable stage receiving a corresponding data enable; and a write driver providing said received data to an array responsive to a write signal and the state of said enable stage, wherein said data stage and said enable stage each comprises:

a plurality of series connected three state drivers; and a latch at an output of each of said three state drivers.

16. A prefetch input driver as in claim 15, wherein the plurality of three state drivers is two drivers.

17. A prefetch input driver as in claim 15, wherein the plurality of three state drivers is four drivers.

18. A prefetch input driver as in claim 17, wherein the first and second drivers are enabled by opposite phases of a first complementary signal pair and the third and fourth drivers are enabled by opposite phases of a second complementary signal pair.

19. A prefetch input driver as in claim 18, wherein the first complementary signal pair is a load data signal and the second complementary signal pair is a write data signal.

20. A prefetch input driver as in claim 19, wherein said integrated circuit is a random access memory and said array is a memory array.

21. A random access memory (RAM) including a plurality of prefetch input write drivers, each of said prefetch input write drivers comprising:

a data input stage including two or more series connected three state drivers and a latch at an output of each of said three state drivers, a first of said three state drivers receiving a data input;

an enable stage including two or more series connected three state drivers and a latch at an output of each of said three state drivers, a first of said three state drivers receiving a corresponding data enable; and a write driver providing said received data to a memory array responsive to a write signal and the state a last latch of said enable stage.

22. A RAM as in claim 21, further comprising:

a NAND gate, the NAND gate receiving the write signal and the state of the last latch, an output of the NAND gate enabling the write driver.

23. A RAM as in claim 22, wherein the latches each comprise a pair of cross coupled inverters.

24. A RAM as in claim 23, wherein the write driver provides a pair of complementary outputs.

25. A RAM as in claim 24, wherein the write driver comprises a pair of three state output drivers.

26. A RAM as in claim 25, further comprising:
   a reset pulse generator generating a reset pulse responsive to said write signal, said first latch in said enable stage being reset by said reset pulse.

27. A RAM as in claim 26, wherein the plurality of three state drivers is two drivers.

28. A RAM as in claim 26, wherein the plurality of three state drivers is four drivers.

29. A RAM as in claim 26, said RAM being a synchronous dynamic RAM (SDRAM), said plurality of prefetch input drivers being at least four prefetch input drivers.

* * * * *